United States Patent
Sho

(10) Patent No.: US 9,972,547 B2
(45) Date of Patent: May 15, 2018

(54) MEASUREMENT METHOD, MANUFACTURING METHOD OF DEVICE, AND MEASUREMENT SYSTEM

(71) Applicant: Toshiba Memory Corporation, Minato-ku (JP)

(72) Inventor: Koutarou Sho, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days. days.

(21) Appl. No.: 15/252,429

(22) Filed: Aug. 31, 2016

(65) Prior Publication Data

US 2017/0263508 A1 Sep. 14, 2017

Related U.S. Application Data

(60) Provisional application No. 62/306,448, filed on Mar. 10, 2016.

(51) Int. Cl.
| | |
|---|---|
| *G01B 11/00* | (2006.01) |
| *H01L 21/66* | (2006.01) |
| *G01B 11/27* | (2006.01) |
| *H01L 23/544* | (2006.01) |
| *H01L 21/67* | (2006.01) |
| *G01Q 60/24* | (2010.01) |
| *H01J 37/22* | (2006.01) |

(52) U.S. Cl.
CPC ............ *H01L 22/12* (2013.01); *G01B 11/272* (2013.01); *H01L 21/67259* (2013.01); *H01L 21/67294* (2013.01); *H01L 23/544* (2013.01); *G01Q 60/24* (2013.01); *H01J 37/22* (2013.01); *H01L 2223/54426* (2013.01)

(58) Field of Classification Search
CPC ............ G01B 11/272; H01L 21/67259; H01L 23/544; G03F 7/70633
USPC .................................................. 356/399–401
See application file for complete search history.

(56) References Cited

U.S. PATENT DOCUMENTS

| | | | |
|---|---|---|---|
| 5,468,580 A | 11/1995 | Tanaka | |
| 6,762,111 B2 | 7/2004 | Fukuda | |
| 6,833,309 B2 | 12/2004 | Fukuda | |
| 2005/0272221 A1* | 12/2005 | Yen | ........................ H01L 23/544 438/401 |

(Continued)

FOREIGN PATENT DOCUMENTS

| | | |
|---|---|---|
| JP | 2001-332466 | 11/2001 |
| JP | 2003-224057 | 8/2003 |
| JP | 2004-179221 | 6/2004 |

*Primary Examiner* — Isiaka Akanbi
(74) *Attorney, Agent, or Firm* — Oblon, McClelland, Maier & Neustadt, L.L.P.

(57) ABSTRACT

According to one embodiment, there is provided a measurement method. The method includes measuring an amount of overlay shift between a first layer and a second layer using a first overlay mark and a second overlay mark. The first layer is provided as a layer including the first overlay mark above a first substrate. The second layer is provided as a layer including the second overlay mark above the first overlay mark. The method includes acquiring a parameter related to asymmetry of a shape of the second overlay mark. The method includes obtaining an amount of correction with respect to a measured value of the amount of overlay shift based on the acquired parameter and the measured amount of overlay shift.

14 Claims, 10 Drawing Sheets

(56) References Cited

U.S. PATENT DOCUMENTS

2009/0262362 A1* 10/2009 de Groot ............. G03F 7/70633
  356/508
2013/0242305 A1* 9/2013 Cohen ................. G03F 7/70633
  356/400
2014/0362363 A1* 12/2014 Cai ..................... G03F 7/70133
  355/77

* cited by examiner

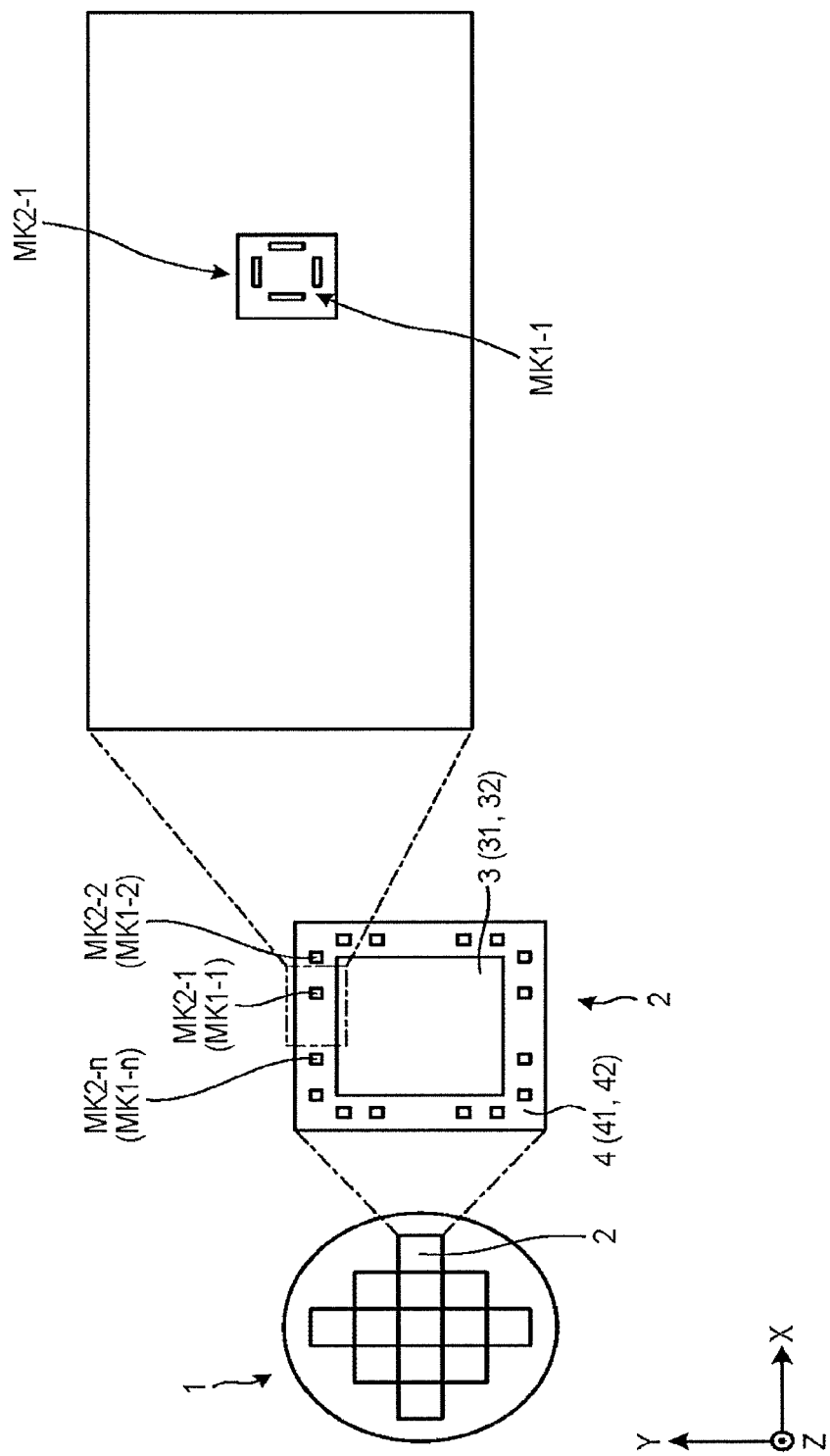

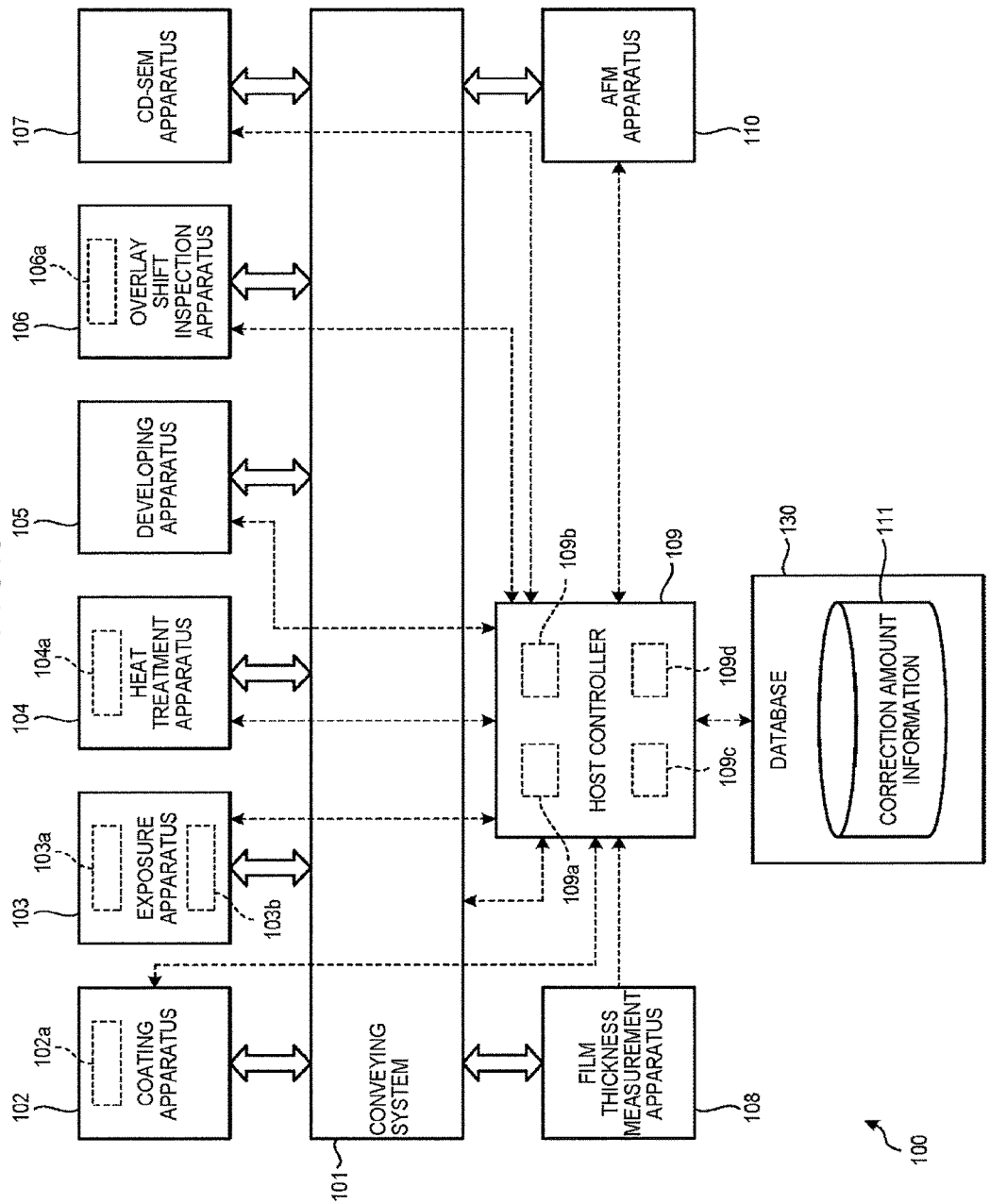

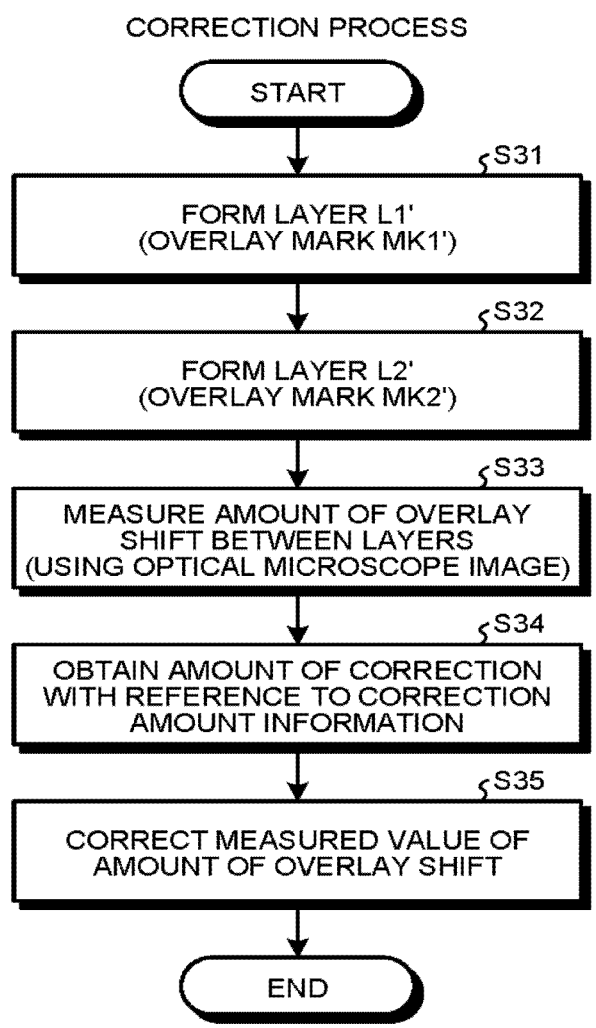

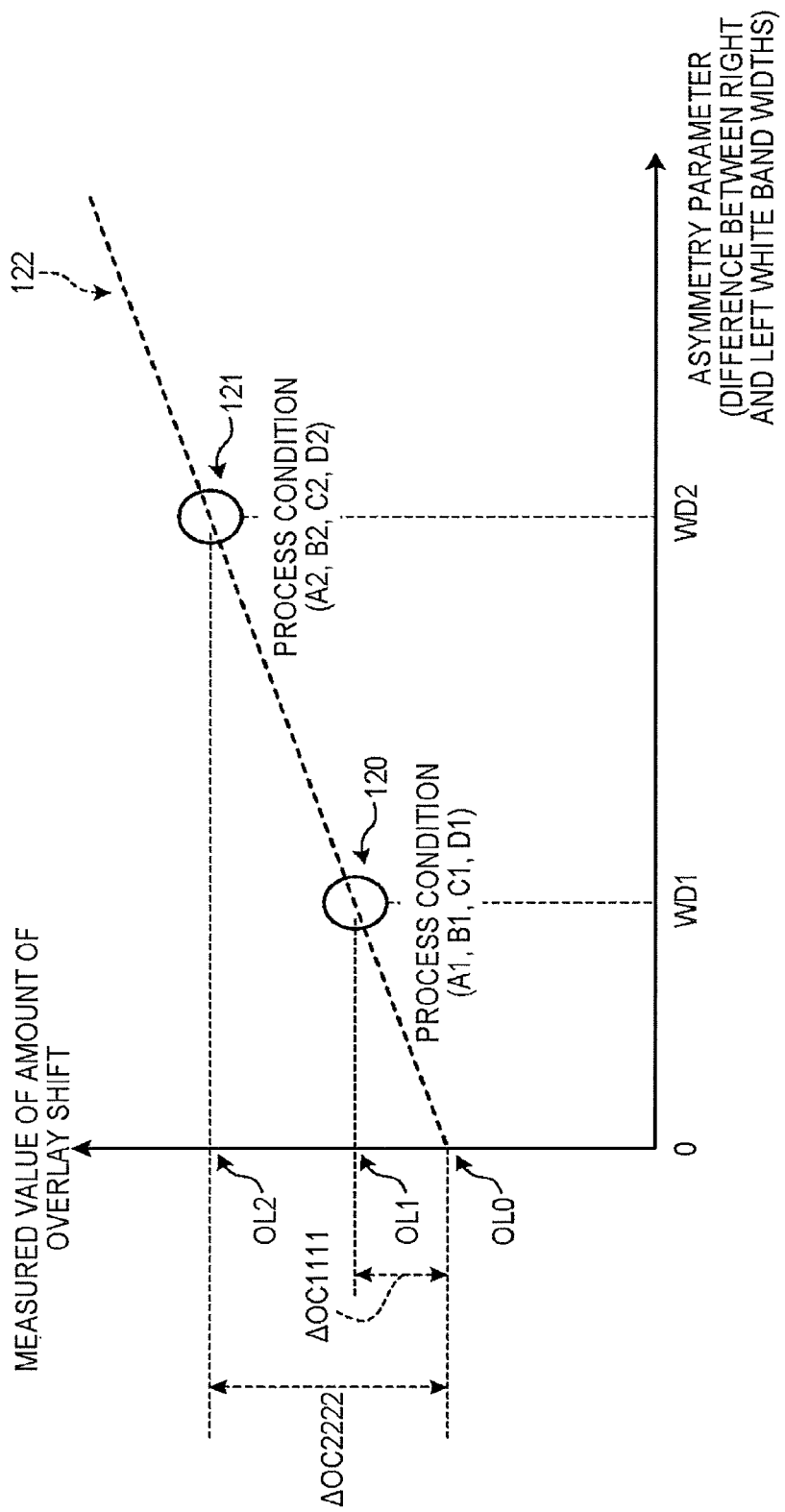

MEASUREMENT METHOD, MANUFACTURING METHOD OF DEVICE, AND MEASUREMENT SYSTEM

CROSS-REFERENCE TO RELATED APPLICATIONS

This application is based upon and claims the benefit of priority from U.S. Provisional Application No. 62/306,448, filed on Mar. 10, 2016; the entire contents of which are incorporated herein by reference.

FIELD

Embodiments described herein relate generally to a measurement method, a manufacturing method of device, and a measurement system.

BACKGROUND

In manufacturing of a semiconductor device including three-dimensional memory cell arrangement, a resist may be formed as a thick film on a multilayer wiring film in order to form a footstep structure in the multilayer wiring film. At this time, there is a desire to measure the amount of overlay shift between layers at high accuracy.

BRIEF DESCRIPTION OF THE DRAWINGS

FIG. 1 a plan view illustrating a configuration of a substrate, a shot region, and an overlay mark in an embodiment;

FIG. 3 is a block diagram illustrating a configuration of a measurement system according to the embodiment;

FIG. 6 is a flowchart illustrating a correction process in the embodiment;

FIG. 8 is a diagram illustrating a correlation between an asymmetry parameter and a measured value of the amount of overlay shift in the embodiment.

DETAILED DESCRIPTION

Figure 2A:
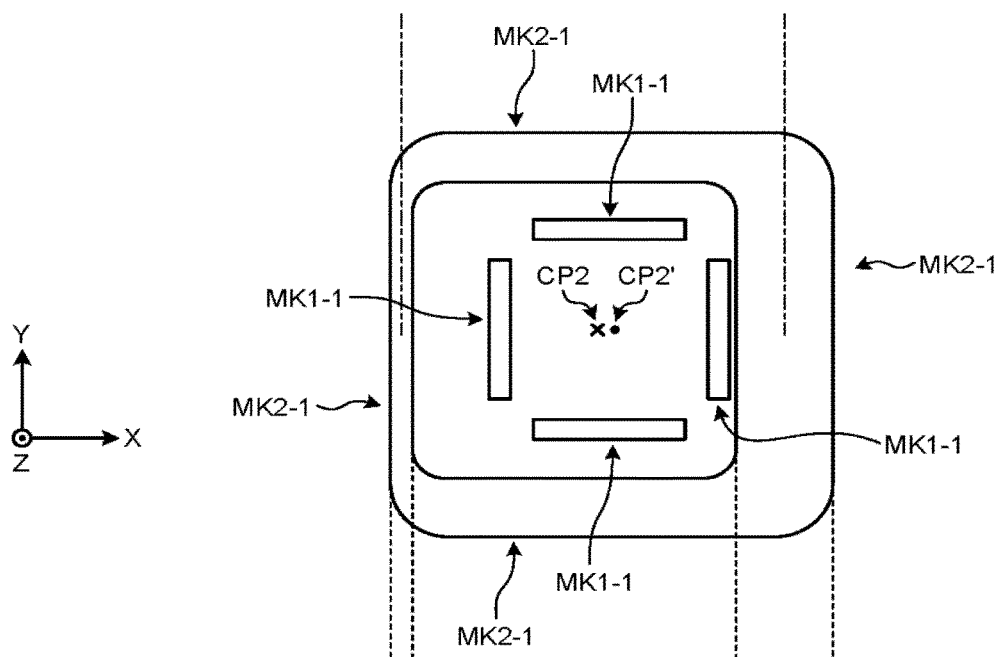
FIG. 2A is a plan view illustrating a configuration of an overlay mark in the embodiment.

In general, according to one embodiment, there is provided a measurement method. The method includes measuring an amount of overlay shift between a first layer and a second layer using a first overlay mark and a second overlay mark. The first layer is provided as a layer including the first overlay mark above a first substrate. The second layer is provided as a layer including the second overlay mark above the first overlay mark. The method includes acquiring a parameter related to asymmetry of a shape of the second overlay mark. The method includes obtaining an amount of correction with respect to a measured value of the amount of overlay shift based on the acquired parameter and the measured amount of overlay shift.

Exemplary embodiments of a measurement method will be explained below in detail with reference to the accompanying drawings. The present invention is not limited to the following embodiments.

Embodiment

The measurement method according to the embodiment is executed in a manufacturing process of a semiconductor device. In the manufacturing process of the semiconductor device, a plurality of layers is stacked above a substrate (for example, a semiconductor substrate). In each of the layers, a device pattern and an overlay mark are formed for each shot region. When the device pattern of each of the layers is stacked, a semiconductor circuit or the like is formed on the substrate. In an inspection process of the semiconductor device, in order to inspect whether upper and lower layers are appropriately aligned, the amount of overlay shift between the upper and lower layers is measured using overlay marks of the upper and lower layers.

In a dimension measuring process of the semiconductor circuit or the like, accurate measurement of a dimension of a minute pattern is the basis of process control and is a technology necessary for mass production of uniform products. However, recently, a level of difficulty of the measurement has become higher every year due to an extremely miniaturization of circuit line width. Similarly, accuracy required for measurement of overlay shift between the upper and lower layers has become precise due to the extremely miniaturization of circuit line width. It is desirable that the overlay mark be formed in a substantially symmetric shape to accurately measure the amount of overlay shift.

For example, as illustrated in FIG. 1, in the manufacturing process of the semiconductor device, a plurality of layers L1 and L2 is stacked above a substrate 1, and a device pattern 3 and a mark pattern 4 as a resist pattern are formed in a device region and a kerf region, respectively, in each shot region 2. FIG. 1 is a plan view illustrating a configuration of the substrate, the shot region, and the overlay mark in the embodiment. Hereinafter, a direction substantially perpendicular to a surface of the substrate 1 is set to a Z direction, and two directions orthogonal to each other within a plane perpendicular to the Z direction are set to an X direction and a Y direction.

The device pattern 3 includes a device pattern 31 of the layer L1 and a device pattern 32 of the layer L2. The device pattern 32 is stacked on/above the device pattern 31. The mark pattern 4 includes a mark pattern 41 of the layer L1 and a mark pattern 42 of the layer L2. The mark pattern 42 is stacked on/above the mark pattern 41 (see FIG. 2B).

The mark pattern 41 includes a plurality of overlay marks MK1-1 to MK1-$n$ ($n$ is an integer greater than or equal to 2). The mark pattern 42 includes a plurality of overlay marks MK2-1 to MK2-$n$. The plurality of overlay marks MK2-1 to MK2-$n$ corresponds to the plurality of overlay marks MK1-1 to MK1-$n$. The respective overlay marks MK2-1 to MK2-$n$ are disposed above the corresponding overlay marks MK1. For example, the overlay mark MK2-1 is disposed above the overlay mark MK1-1. For example, the overlay mark MK2-1 may be observed by measurement of overlay shift as an edge (side surface in a cross-sectional shape) of an opening pattern 42$a$ in the mark pattern 42. For example, the overlay mark MK1-1 may be observed by measurement of overlay shift as a film 41b (for example, a conductive film or an insulating film) disposed on a film 41a (for example, another insulating film) in the mark pattern 41. The overlay marks MK2 and the overlay marks MK1 ideally have symmetric shapes with respect to the X direction and the Y direction, respectively. When each of an overlay mark MK2 and an overlay mark MK1 corresponding to each other has a symmetric shape, the amount of discrepancy between a center of the overlay mark MK2 and a center of the overlay mark MK1 may be measured as the amount of overlay shift between the layer L1 and the layer L2.

However, since miniaturization would have recently reached a limit, a cell having a stacked structure has been developed. Here, the cell is referred to as a three-dimensional (3D) device formed by stacking a conductive film (word line electrode) in a longitudinal direction. In the 3D device, a string is formed in the longitudinal direction, and thus a conductive film in a peripheral region needs to be formed in a stepped shape to draw a wire. That is, in manufacturing of a semiconductor device including 3D memory cell arrangement, a resist may be formed as a thick film on a multilayer wiring film in order to form a footstep structure in the multilayer wiring film.

For example, a resist pattern of a thick film is formed on a stacked film, in which a conductive film and an insulating film are alternately stacked a plurality of times, and the conductive film in the stacked film is formed in a stepwise by repeating processing of the stacked film using a resist pattern as a mask by anisotropic etching of reactive ion etching (RIE) and slimming of the resist pattern by isotropic etching of RIE.

At this time, the above-described process becomes a super-thick film process in which a film thickness of the resist pattern formed on the stacked film becomes significantly thick (for example, greater than 5 μm). Thus, a cross-sectional shape of the overlay mark is easily distorted into an asymmetric shape due to influence of film stress in the resist pattern. In this way, in the testing process of the semiconductor device, the amount of overlay shift may be deceived such that the amount of overlay shift is shifted from a value to be ideally measured (that is, a value to be measured by the overlay mark of the symmetric shape) by a value corresponding to asymmetry of the cross-sectional shape.

Figure 2B:
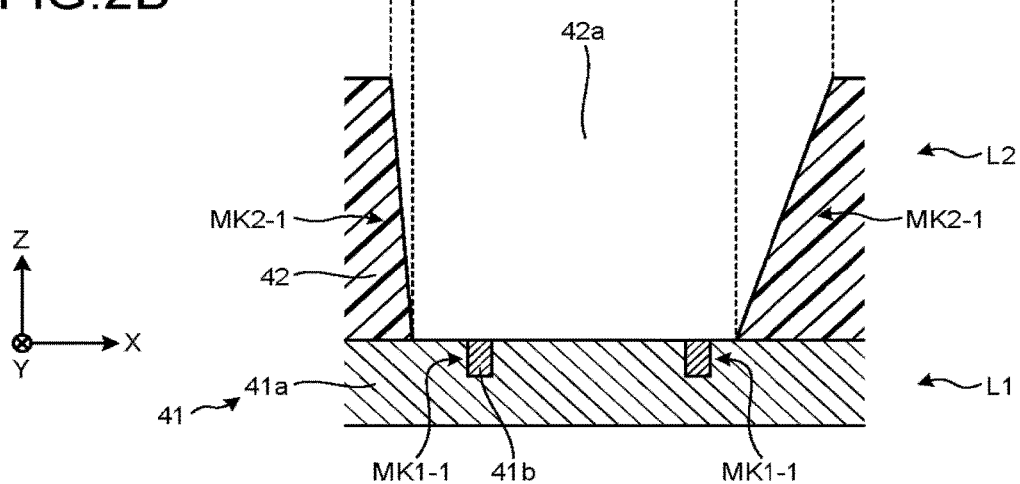
FIG. 2B is a cross sectional view illustrating a configuration of the overlay mark in the embodiment.

For example, as illustrated in FIG. 2A and FIG. 2B, the overlay mark MK2-1 included in the mark pattern (resist pattern) 42 formed as a thick film has a cross-sectional shape asymmetrically distorted in the X direction due to, for example, influence of film stress in the X direction in the mark pattern (resist pattern) 42. The amount of overlay shift is measured using an optical microscope, resolving power of which is insufficiently high when compared to a dimension of the pattern and using an optical microscope image in which an outline of the pattern is vague. For this reason, in measurement of the amount of overlay shift in the X direction, a center of an edge width of each of a −X side edge and a +X side edge of the overlay mark MK2-1 is regarded as an edge position. That is, positions indicated by alternate long and short dash lines in FIG. 2A are regarded as the −X side edge and the +X side edge of the overlay mark MK2-1 with regard to the X direction. In this way, a center CP2 of the overlay mark MK2-1 may be measured to be shifted from an ideal center CP2' of the overlay mark MK2-1. As a result, a measurement error (deception of the amount of overlay shift) may occur in measurement of the amount of discrepancy between a center of the overlay mark MK2 and a center of the overlay mark MK1.

In this regard, in measurement of the amount of overlay shift, measuring the amount of overlay shift by the overlay marks MK2 and MK1, acquiring an asymmetry parameter related to asymmetry of a shape of the overlay mark MK2, and obtaining the amount of correction of overlay shift measurement for each process condition based on the acquired asymmetry parameter and the measured value of the amount of overlay shift, are performed. With these operations, measurements of the amount of overlay shift which is not deceived by distortion of a cross-sectional shape of the resist can be achieved.

Specifically, the amount of overlay shift is measured using a measurement system 100 illustrated in FIG. 3. FIG. 3 is a block diagram illustrating a configuration of the measurement system 100.

The measurement system 100 includes a conveying system 101, a coating apparatus 102, an exposure apparatus 103, a heat treatment apparatus 104, a developing apparatus 105, an overlay shift inspection apparatus 106, a CD-SEM (electron microscope) apparatus 107, a film thickness measurement apparatus 108, a host controller 109, an AFM (atomic force microscope) apparatus 110, and a database 130. The coating apparatus 102, the exposure apparatus 103, the heat treatment apparatus 104, the developing apparatus 105, the overlay shift inspection apparatus 106, the CD-SEM apparatus 107, the film thickness measurement apparatus 108, and the AFM apparatus 110 are configured with respect to one another to be able to convey the substrate 1 through the conveying system 101.

The host controller 109 is connected to the conveying system 101, the coating apparatus 102, the exposure apparatus 103, the heat treatment apparatus 104, the developing apparatus 105, the overlay shift inspection apparatus 106, the CD-SEM apparatus 107, the film thickness measurement apparatus 108, the AFM apparatus 110, and the database 130 through a communication line (not illustrated) such that the host controller 109 may communicate therewith. The host controller 109 controls each of the conveying system 101, the coating apparatus 102, the exposure apparatus 103, the heat treatment apparatus 104, the developing apparatus 105, the overlay shift inspection apparatus 106, the CD-SEM apparatus 107, the film thickness measurement apparatus 108, and the AFM apparatus 110 and may refer to the database 130.

The coating apparatus 102 has a resist feeder 102a. The exposure apparatus 103 has an illumination optical system 103a and a projection optical system 103b. The heat treatment apparatus 104 has a heater 104a. The overlay shift inspection apparatus 106 has an optical microscope 106a. The host controller 109 has a first operation unit 109a, a second operation unit 109b, a third operation unit 109c, and a fourth operation unit 109d. Each of the first operation unit 109a, the second operation unit 109b, the third operation unit 109c, and the fourth operation unit 109d may be implemented inside the host controller 109 as hardware (for example, as a circuit), and may be implemented as software (for example, as a functional module stored in a memory (not illustrated) and read at one time or successively read according to progress of processing). Alternatively, some functions of each of the operation units may be implemented as hardware, and the remaining functions may be implemented as software.

Figure 4:
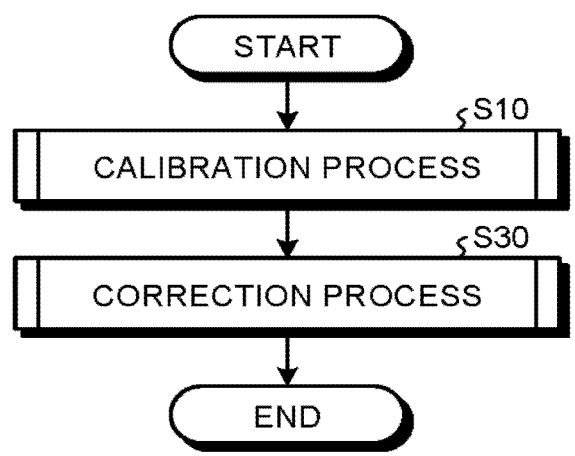
FIG. 4 is a flowchart illustrating an operation of the measurement system (a measurement method) according to the embodiment.

Next, an operation of the measurement system 100 will be described using FIG. 4. FIG. 4 is a flowchart illustrating the operation of the measurement system 100.

The measurement system 100 performs a calibration process (S10) that obtains the amount of correction in advance using the substrate 1 for trial. For example, a plurality of substrates 1 for trial is prepared, the respective substrates 1 are processed under a plurality of different process conditions, the amount of overlay shift is measured and an asymmetry parameter is obtained with respect to each of the obtained substrates 1, and the amount of correction with respect to each process condition is obtained. The obtained amount of correction is stored as correction amount information 111 in the database 130 such that the obtained amount of correction is associated with each process condition (for example, in a table form). In addition, upon measuring the amount of overlay shift of a substrate 1' for product, the measurement system 100 corrects a measured value of the amount of overlay shift with reference to the correction amount information 111 according to a process condition used for the substrate 1' for product (S30). In this way, it is possible to measure the amount of overlay shift which is not deceived by distortion of a cross-sectional shape of the mark pattern (resist pattern) 42.

Figure 5:
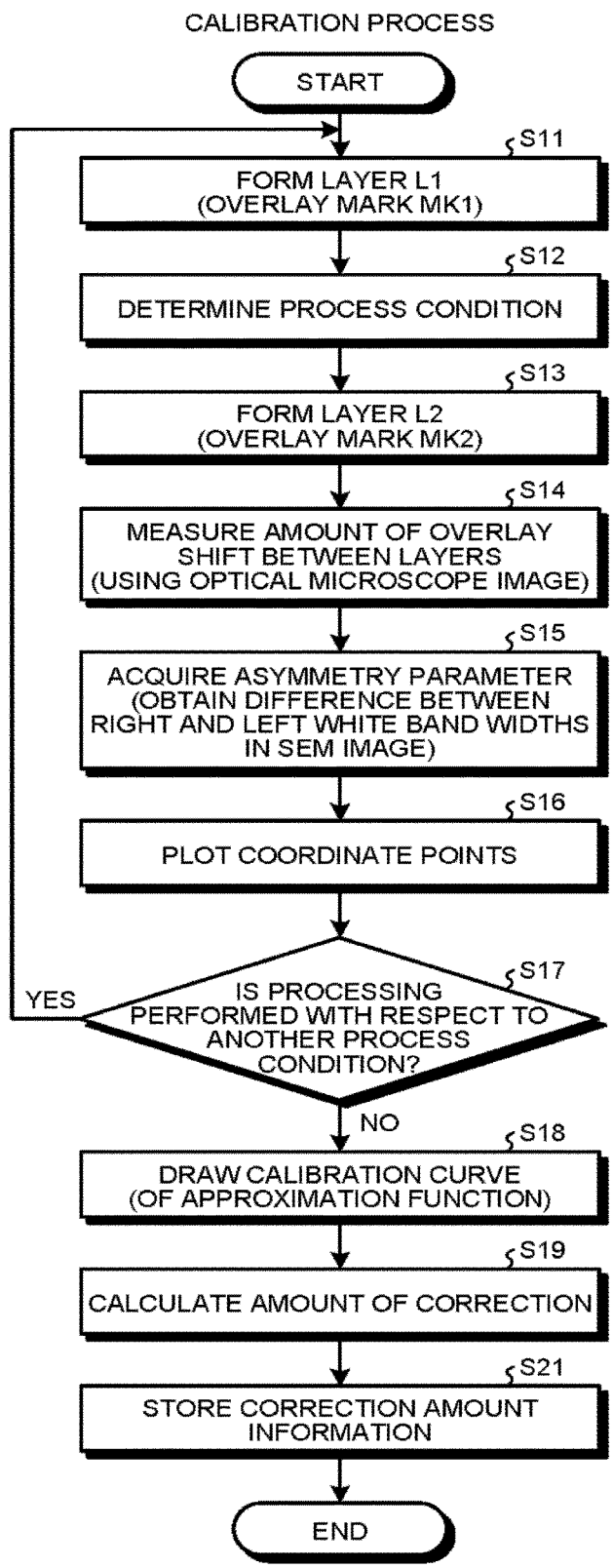
FIG. 5 is a flowchart illustrating a calibration process in the embodiment.

Next, details of the calibration process (S10) will be described using FIG. 5. FIG. 5 is a flowchart illustrating a flow of the calibration process (S10).

The measurement system 100 forms the layer L1 including the overlay mark MK1 (the device pattern 31, the mark pattern 41) above the substrate 1 for trial under the control of the host controller 109 (S11).

The measurement system 100 determines a plurality of process conditions to be used for formation of the layer L2 (S12). For example, the plurality of process conditions includes a baking temperature after application (process condition A), a baking temperature after light exposure (process condition B), an illumination condition of the exposure apparatus 103 (process condition C), and a film thickness of the resist (process condition D). For example, (process condition A, process condition B, process condition C, process condition D)=(A1, B1, C1, D1) is determined. For example, A1 is 120° C. For example, B1 is 140° C. For example, D1 is 5 µm. The baking temperature after application (process condition A) is a baking temperature at which the substrate 1 is to be maintained by baking after application by the heat treatment apparatus 104. The baking temperature after light exposure (process condition B) is a baking temperature at which the substrate 1 is to be maintained by baking after light exposure by the heat treatment apparatus 104. The illumination condition of the exposure apparatus 103 (process condition C) is a illumination condition (for example, an object-side numerical aperture (NA), a size of an effective light source σ=(image-side numerical aperture)/(object-side numerical aperture)) applied when the substrate 1 is exposed by the exposure apparatus 103. The film thickness of the resist (process condition D) is a film thickness of a resist coating film to be formed above the substrate 1 by the coating apparatus 102 (or the amount of the resist supplied to the substrate 1 corresponding to the film thickness).

The measurement system 100 forms the layer L2 including the overlay mark MK2 (the device pattern 32, the mark pattern 42) above the layer L1 under the process condition determined in S12 and under the control of the host controller 109 (S13). For example, the conveying system 101 conveys the substrate 1 to the coating apparatus 102. The coating apparatus 102 applies the resist onto the substrate 1, and forms the resist coating film at the film thickness determined in S12. For example, the substrate 1 is formed using a material mainly containing a semiconductor such as silicon. For example, the resist may be a chemically amplified resist. The conveying system 101 conveys the substrate 1, above which the resist coating film is formed, from the coating apparatus 102 to the heat treatment apparatus 104. The heat treatment apparatus 104 heats the substrate 1, maintains the substrate 1 at the baking temperature determined in S12, and conducts a heat treatment (baking after application) on the substrate 1. The conveying system 101 conveys the substrate 1 subjected to the heat treatment from the heat treatment apparatus 104 to the exposure apparatus 103. The exposure apparatus 103 exposes the substrate 1 under the illumination condition determined in S12, transfers a certain pattern to the resist coating film through a mask, and forms a latent image pattern. The conveying system 101 conveys the substrate 1, on which the latent image pattern is formed, from the exposure apparatus 103 to the heat treatment apparatus 104. The heat treatment apparatus 104 heats the substrate 1, maintains the substrate 1 at the baking temperature determined in S12, and conducts a heat treatment (baking after light exposure) on the substrate 1. The conveying system 101 conveys the substrate 1 subjected to the heat treatment from the heat treatment apparatus 104 to the developing apparatus 105. The developing apparatus 105 develops the latent image pattern of the resist to form a resist pattern. The conveying system 101 conveys the substrate 1, on which the resist pattern (the device pattern 32, the mark pattern 42) is formed, to the overlay shift inspection apparatus 106.

The measurement system 100 measures the amount of overlay shift between the layer L1 and the layer L2 using the overlay mark MK1 and the overlay mark MK2 under the control of the host controller 109 (S14).

Figure 7A:
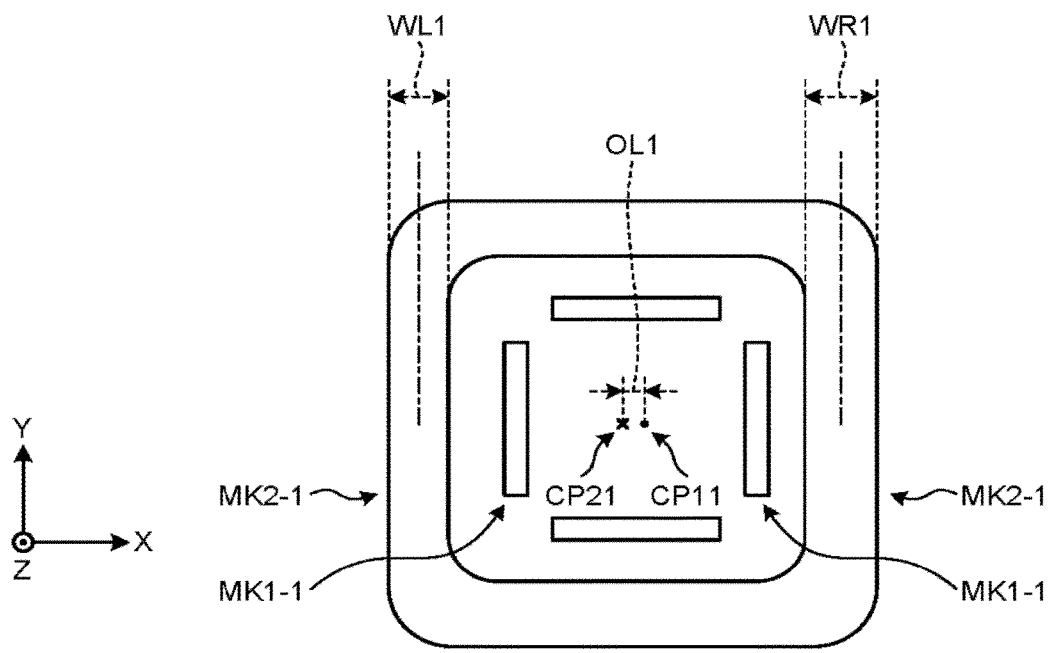
FIG. 7A and FIG. 7B are plan views illustrating planar images of overlay marks in the embodiment.

For example, it is presumed that a planar image of the overlay mark MK1 and the overlay mark MK2 becomes a planar image illustrated in FIG. 7A when the layer L2 is formed in S13 according to (process condition A, process condition B, process condition C, process condition D)=(A1, B1, C1, D1) determined in S12. FIG. 7A is a plan view illustrating the planar image of the overlay marks MK1 and MK2. The overlay shift inspection apparatus 106 images the overlay mark MK1 and the overlay mark MK2 using the optical microscope 106a, and acquires a planar image in which an outline of a pattern is vague. For this reason, in measurement of the amount of overlay shift in the X direction, a center of an edge width of each of a −X side edge and a +X side edge of the overlay mark MK2-1 is regarded as an edge position. That is, positions indicated by alternate long and short dash lines in FIG. 2A are regarded as the −X side edge and the +X side edge of the overlay mark MK2-1 with regard to the X direction. In addition, with respect to the Y direction, a center of an edge width of each of a −Y side edge and a +Y side edge of the overlay mark MK2-1 is regarded as an edge position. Further, a center CP21 of the overlay mark MK2-1 is determined as a point corresponding to a central position of the −X side edge and the +X side edge and a central position of the −Y side edge and the +Y side edge of the overlay mark MK2-1. Similarly, a center CP11 of the overlay mark MK1-1 is determined as a point corresponding to a central position of the −X side edge and the +X side edge and a central position of the −Y side edge and the +Y side edge of the overlay mark MK1-1. Furthermore, the amount of discrepancy between the center CP21 of the overlay mark MK2-1 and the center CP11 of the overlay mark MK1-1 is obtained as the amount of overlay shift OL1.

The measurement system 100 acquires an asymmetry parameter related to asymmetry of a shape of the overlay mark MK2 under the control of the host controller 109 (S15). Specifically, the measurement system 100 obtains, as an asymmetry parameter, a difference in white band width (a difference between right and left white band widths) in a direction in which asymmetry is generated in an SEM image.

For example, the conveying system 101 delivers the substrate 1 from the overlay shift inspection apparatus 106 to the CD-SEM apparatus 107. The CD-SEM apparatus 107 images the overlay mark MK2-1 using an electron microscope to acquire a planar image as illustrated in FIG. 7A. The CD-SEM apparatus 107 measures a white band width in a direction in which asymmetry is generated (X direction). That is, the CD-SEM apparatus 107 measures a white band width WL1 with respect to the −X side edge of the overlay mark MK2-1, and measures a white band width WR1 with respect to the +X side edge of the overlay mark MK2-1. The CD-SEM apparatus 107 supplies the measured white band widths WL1 and WR1 to the host controller 109. The host controller 109 obtains a difference WD1 (=WR1−WL1) between the white band width WL1 and the white band width WR1 as an asymmetry parameter.

The measurement system 100 plots coordinate points including, as coordinates, the measured value obtained in S14 and the asymmetry parameter obtained in S15 to obtain a correlation between the measured value of the amount of overlay shift and the asymmetry parameter under the control of the host controller 109 (S16). For example, the host controller 109 plots the coordinate points including, as coordinates, the measured value obtained in S14 and the asymmetry parameter obtained in S15 on a virtual plane as illustrated in FIG. 8 in which a vertical axis depicts a measured value of the amount of overlay shift and a horizontal axis depicts an asymmetry parameter. FIG. 8 is a diagram illustrating a correlation between an asymmetry parameter and a measured value of the amount of overlay shift. When the layer L2 is formed in S13 according to (process condition A, process condition B, process condition C, process condition D)=(A1, B1, C1, D1) determined in S12, a coordinate point 120=(WD1, OL1) is plotted on the virtual plane.

Figure 7B:
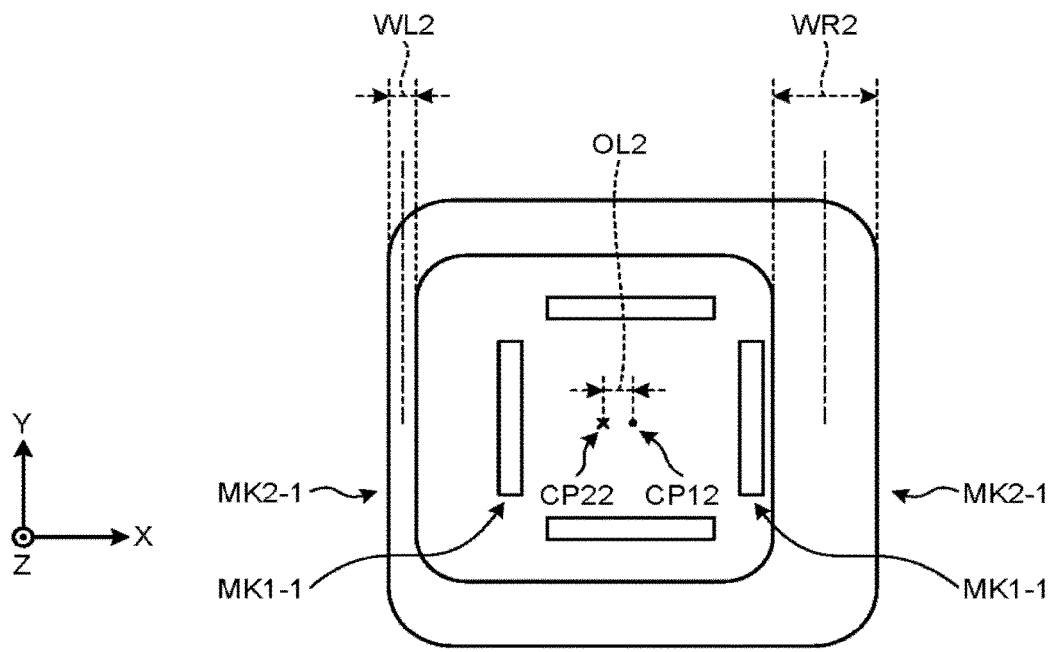

The measurement system 100 determines whether to perform processing of S11 to S16 with respect to another process condition (S17). When the number of plots is insufficient to draw a calibration curve, the measurement system 100 determines that processing of S11 to S16 needs to be performed with respect to another process condition (Yes in S17), and prepares another substrate 1. The measurement system 100 forms the layer L1 above the substrate 1 (S11), and determines another process condition as a process condition of the layer L2 (S12). For example, (process condition A, process condition B, process condition C, process condition D)=(A2, B2, C2, D2) is determined. For example, A2 is 120° C. For example, B2 is 130° C. For example, D2 is 5 μm. In addition, the measurement system 100 forms the layer L2 in S13 according to (process condition A, process condition B, process condition C, process condition D)=(A2, B2, C2, D2) determined in S12, measures the amount of overlay shift between the layer L1 and the layer L2 to obtain a measured value OL2 (S14), and obtains WD2 (=WR2−WL2) as an asymmetry parameter (S15). For example, the amount of discrepancy between a center CP22 of the overlay mark MK2-1 and a center CP12 of the overlay mark MK1-1 is obtained as the amount of overlay shift OL2 (see FIG. 7B). In addition, the measurement system 100 additionally plots a coordinate point 121=(WD2, OL2) on a virtual plane as illustrated in FIG. 8 (S16).

When a sufficient number of plots are obtained to draw a calibration curve, the measurement system 100 determines that it is unnecessary to perform processing of S11 to S16 with respect to another process condition (No in S17), and draws a calibration curve on the virtual plane (S18). For example, as illustrated in FIG. 8, the measurement system 100 sets a straight line (linear approximation function) which approximately passes through at least a plurality of coordinate points 120 and 121 as a calibration curve 122. When the number of coordinate points is greater than or equal to three, an approximately straight line (linear approximation function) with respect to a plurality of coordinate points may be obtained using the least-squares method and set as the calibration curve 122.

The measurement system 100 obtains the amount of correction with respect to the measured value of the amount of overlay shift using the calibration curve 122 drawn in S18 (S19).

Specifically, as illustrated in FIG. 8, the measurement system 100 may extrapolate the amount of overlay shift (=OL0) corresponding to a case in which asymmetry is not present by taking the vertical intercept OL0 of the calibration curve 122. That is, the measurement system 100 obtains the amount of overlay shift OL0 with respect to a value (=0) of an asymmetry parameter corresponding to a case in which asymmetry is not present using the calibration curve 122 (linear approximation function). Further, the measurement system 100 may specify a measurement error of the amount of overlay shift by taking a difference between the extrapolated amount of overlay shift OL0 and the measured amount of overlay shift. For example, the measurement system 100 may specify a measurement error $\Delta OC1111=OL1-OL0$ as the amount of correction with respect to (process condition A, process condition B, process condition C, process condition D)=(A1, B1, C1, D1). Alternatively, for example, the measurement system 100 may specify a measurement error $\Delta OC2222=OL2-OL0$ as the amount of correction with respect to (process condition A, process condition B, process condition C, process condition D)=(A2, B2, C2, D2).

Figure 9:
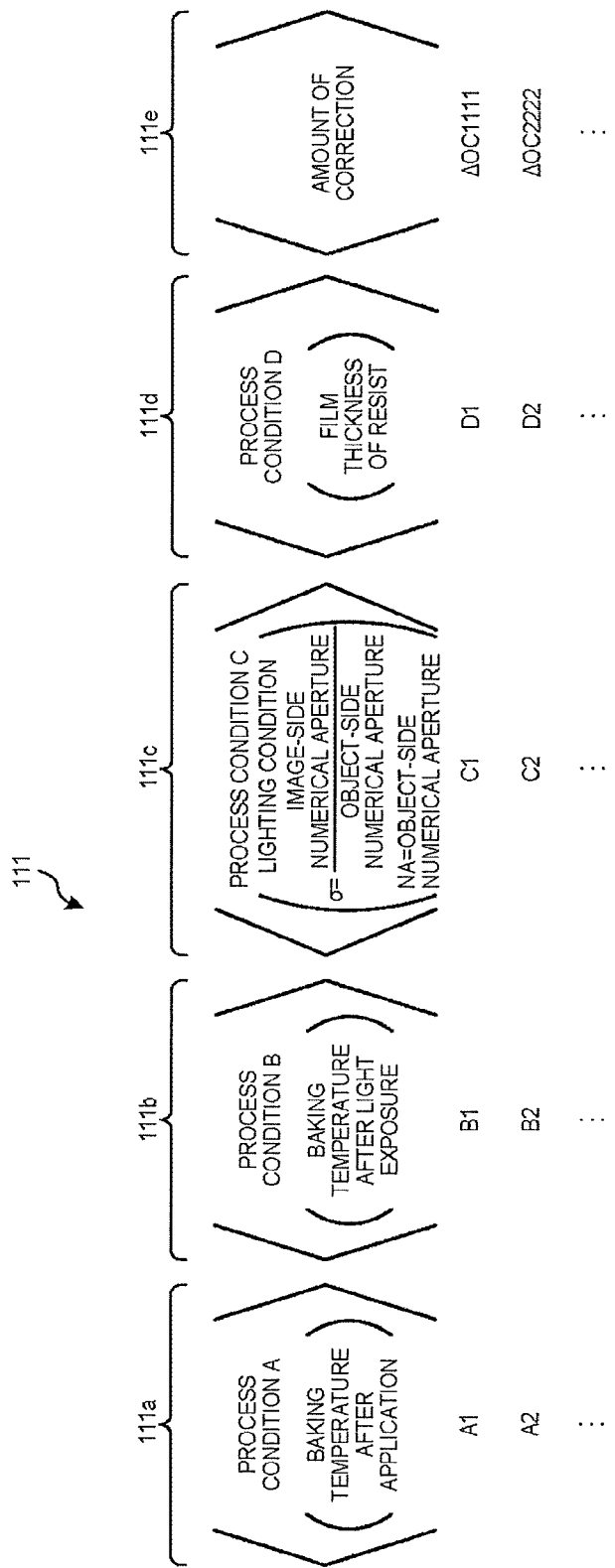
FIG. 9 is a diagram illustrating a data structure of correction amount information in the embodiment.

The measurement system 100 creates the correction amount information 111 using the amount of correction obtained in S19, and stores the created correction amount information 111 in the database 130 (S21). For example, the host controller 109 creates the correction amount information 111 illustrated in FIG. 9 such that the amount of correction obtained in S19 is associated with the plurality of process conditions (process condition A, process condition B, process condition C, process condition D). FIG. 9 is a diagram illustrating a data structure of the correction amount information 111. The correction amount information 111 has a "process condition A" section 111a, a "process condition B" section 111b, a "process condition C" section 111c, a "process condition D" section 111d, and an "amount of correction" section 111e. The amount of correction corresponding to (process condition A, process condition B, process condition C, process condition D)=(A1, B1, C1, D1) may be found to be $\Delta OC1111$ (=OL1−OL0) by referring to the correction amount information 111. In addition, the amount of correction corresponding to (process condition A, process condition B, process condition C, process condition D)=(A2, B2, C2, D2) may be found to be $\Delta OC2222$ (=OL2−OL0). The host controller 109 stores the created correction amount information 111 in the database 130.

Next, details of the correction process (S30) will be described using FIG. 6. FIG. 6 is a flowchart illustrating a flow of the correction process (S30).

The measurement system 100 forms a layer L1' (the device pattern 31, the mark pattern 41) including an overlay mark MK1' above the substrate 1' for product under the control of the host controller 109 (S31). The measurement system 100 forms a layer L2' (the device pattern 32, the mark pattern 42) including an overlay mark MK2' above the layer L1' under the control of the host controller 109 (S32).

The measurement system 100 measures the amount of overlay shift between the layer L1' and the layer L2' using the overlay mark MK1' and the overlay mark MK2' under the control of the host controller 109 (S33). Specifically, processing similar to S14 is performed.

The measurement system 100 obtains the amount of correction with respect to the measured value of the amount of overlay shift corresponding to the plurality of process conditions (process condition A, process condition B, process condition C, process condition D) used in S32 with reference to the correction amount information 111 (S34). For example, when the plurality of process conditions used in S32 corresponds to (process condition A, process condition B, process condition C, process condition D)=(A1, B1, C1, D1), the host controller 109 obtains ΔOC1111 as the amount of correction with reference to the correction amount information 111.

The measurement system 100 corrects the measured value obtained in S33 using the amount of correction obtained in S34 (S35). For example, when the plurality of process conditions used in S32 corresponds to (process condition A, process condition B, process condition C, process condition D)=(A1, B1, C1, D1), a measured value OL11' after correction may be obtained by subtracting the amount of correction ΔOC1111 from the measured value OL11 obtained in S33. In this way, it is possible to cancel a measurement error of the amount of overlay shift due to asymmetry of a cross-sectional shape of the overlay mark MK2', and to measure the ideal amount of overlay shift.

As described in the foregoing, in the present embodiment, in measurement of the amount of overlay shift, the amount of overlay shift is measured by the overlay marks MK2 and MK1, the asymmetry parameter related to asymmetry of the shape of the overlay mark MK2 is acquired, and the amount of correction of overlay shift measurement for each process condition is obtained based on the acquired parameter and the measured amount of overlay shift. For example, the ideal amount of overlay shift is extrapolated from the asymmetry parameter and the measured value of the amount of overlay shift, and difference between the ideal amount of overlay shift and the measured value of the amount of overlay shift is taken to obtain the amount of correction. In this way, for each process condition, it is possible to measure the amount of overlay shift which is not deceived by distortion (asymmetry) of a cross-sectional shape of a resist of the overlay mark MK2.

It should be noted that, although the present embodiment illustrates a case in which asymmetry of the overlay mark MK2 is generated in the X direction, when asymmetry of the overlay mark MK2 is generated in the Y direction, an asymmetry parameter may be set as a difference between upper and lower white band widths in place of the difference between right and left white band widths. In addition, when asymmetry of the overlay mark MK2 is generated in the X direction and the Y direction, an asymmetry parameter may be set as the difference between upper and lower white band widths in addition to the difference between right and left white band widths.

Alternatively, in S15 of FIG. 5, the white band width may be measured by the AFM apparatus 110 in place of the CD-SEM apparatus 107. For example, the planar image illustrated in FIG. 7A or FIG. 7B may be acquired by the AFM apparatus 110.

Figure 10:
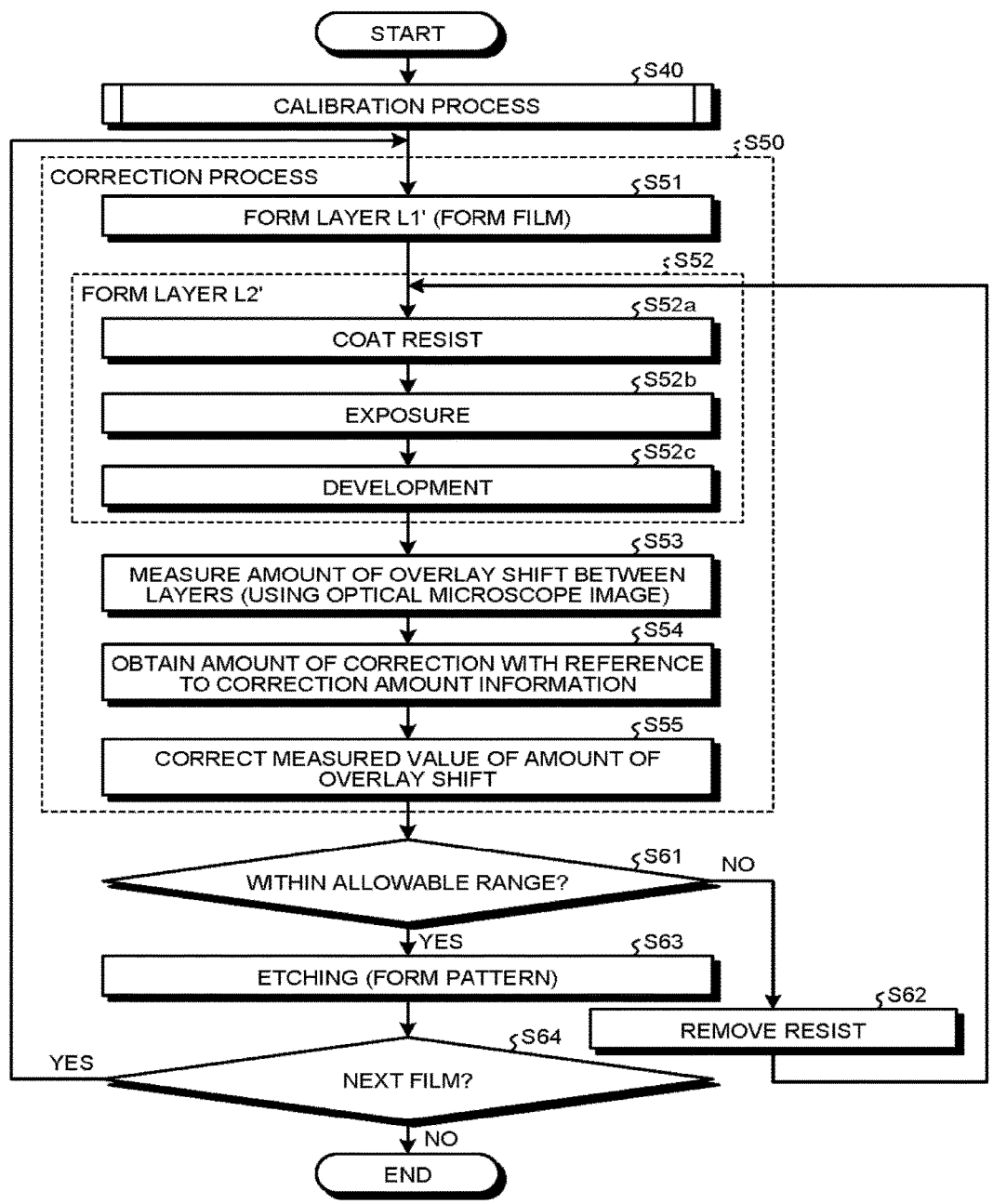
FIG. 10 is a diagram illustrating manufacturing method of device to which the measurement method according to the embodiment is applied.

Next, manufacturing method of device to which the measurement method according to the embodiment is applied will be described using FIG. 10. FIG. 10 is a flowchart illustrating the manufacturing method of device to which the measurement method according to the embodiment is applied.

A plurality of substrates 1 for trial are prepared, and the measurement system 100 performs a calibration process (S40), as in S10 of FIG. 4.

Then, a substrate 1' for product is prepared and the measurement system 100 performs manufacturing process of device (e.g., semiconductor device). At first, the measurement system 100 performs a correction process (S50), as in S30 of FIG. 4.

Specifically, the measurement system 100 forms a layer L1' (S51), as in S31 of FIG. 5. That is, the measurement system 100 forms a film to be patterned, on the substrate 1'.

The measurement system 100 forms a layer L2' including an overlay mark MK2' above the layer L1' under the control of the host controller 109 (S52), as in S32 of FIG. 5.

For example, the conveying system 101 conveys the substrate 1' to the coating apparatus 102. The coating apparatus 102 applies the resist onto the substrate 1' (S52a), and forms the resist coating film at the film thickness according to the process condition.

The conveying system 101 conveys the substrate 1', above which the resist coating film is formed, from the coating apparatus 102 to the heat treatment apparatus 104. The heat treatment apparatus 104 heats the substrate 1', maintains the substrate 1' at the baking temperature according to the process condition, and conducts a heat treatment (baking after application) on the substrate 1'.

The conveying system 101 conveys the substrate 1' subjected to the heat treatment from the heat treatment apparatus 104 to the exposure apparatus 103. The exposure apparatus 103 exposes the substrate 1 under the illumination condition according to the process condition (S52b), transfers a certain pattern to the resist coating film through a mask, and forms a latent image pattern.

The conveying system 101 conveys the substrate 1', on which the latent image pattern is formed, from the exposure apparatus 103 to the heat treatment apparatus 104. The heat treatment apparatus 104 heats the substrate 1', maintains the substrate 1' at the baking temperature according to the process condition, and conducts a heat treatment (baking after light exposure) on the substrate 1'.

The conveying system 101 conveys the substrate 1 subjected to the heat treatment from the heat treatment apparatus 104 to the developing apparatus 105. The developing apparatus 105 develops the latent image pattern of the resist to form a resist pattern (S52c). The conveying system 101 conveys the substrate 1', on which the resist pattern is formed, to the overlay shift inspection apparatus 106.

The measurement system 100 (the overlay shift inspection apparatus 106) measures the amount of overlay shift between the layer L1' and the layer L2' using the overlay mark MK1' and the overlay mark MK2' under the control of the host controller 109 (S53), as in S33 of FIG. 5.

The measurement system 100 obtains the amount of correction with respect to the measured value of the amount of overlay shift corresponding to the plurality of process conditions (process condition A, process condition B, process condition C, process condition D) used in S52 with reference to the correction amount information 111 (S54), as in S34 of FIG. 5.

The measurement system 100 corrects the measured value obtained in S53 using the amount of correction obtained in S54 (S55), as in S35 of FIG. 5.

The measurement system 100 determine whether the corrected amount of overlay shift is within the allowable range (S61).

If the corrected amount of overlay shift is out of the allowable range (No in S61), the measurement system 100 removes resist (S62). For example, the conveying system 101 conveys the substrate 1' from the overlay shift inspection apparatus 106 to a resist removing apparatus (not shown). The resist removing apparatus removes the resist with wet-etching or dry-etching. The conveying system 101 conveys the substrate 1' out of the resist removing apparatus. Then, the measurement system 100 returns the process back to S52.

If the corrected amount of overlay shift is within the allowable range (Yes in S61), the measurement system 100 performs etching to form a pattern in the layer L2' (S63). For example, the conveying system 101 conveys the substrate 1' from the overlay shift inspection apparatus 106 to an etching device (e.g., RIE apparatus, not shown). The etching device etches the film with using the layer L2' (the resist pattern) as a mask to form a pattern in the layer L1' (the film to be patterned).

If the next film to be formed is present (Yes in S64), the measurement system 100 returns the process back to S50. If the next film to be formed is not present (No in S64), the measurement system 100 finishes the process.

Thus, by means of repeating S50 to S64, a device (e.g., a semiconductor device) with multiple films formed on the substrate 1' is manufactured.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A measurement method comprising:
    measuring an amount of overlay shift between a first layer and a second layer using a first overlay mark and a second overlay mark, the first layer being provided as a layer including the first overlay mark above a first substrate, the second layer being provided as a layer including the second overlay mark above the first overlay mark;
    acquiring a parameter related to asymmetry of a shape of the second overlay mark; and
    obtaining an amount of correction with respect to a measured value of the amount of overlay shift based on the acquired parameter and the measured amount of overlay shift, wherein
    the obtaining of the amount of correction includes
        obtaining a correlation between the parameter and the measured value of the amount of overlay shift, and
        obtaining the amount of correction based on the correlation, the obtaining of the amount of correction based on the correlation includes
            extrapolating an amount of overlay shift corresponding to a case in which asymmetry is not present in the correlation, and
            taking a difference between the extrapolated amount of overlay shift and the measured amount of overlay shift to obtain the amount of correction,
    the obtaining of the correlation includes
        obtaining a function of a parameter related to asymmetry and a measured value of an amount of overlay shift based on the acquired parameter and the measured amount of overlay shift with respect to a plurality of process conditions, and
    the extrapolating includes obtaining an amount of overlay shift with respect to a value of the parameter corresponding to a case in which asymmetry is not present using the function.

2. The measurement method according to claim 1, further comprising:
    measuring an amount of overlay shift between a third layer and a fourth layer using a third overlay mark and a fourth overlay mark, the third layer being provided as a layer including the third overlay mark above a second substrate and corresponding to the first layer, the fourth layer being provided as a layer including the fourth overlay mark above the third overlay mark and corresponding to the second layer; and
    correcting the measured amount of overlay shift between the third layer and the fourth layer using the amount of correction.

3. The measurement method according to claim 1, wherein
    the acquiring of the parameter includes acquiring the parameter by evaluating a planar image of the second overlay mark.

4. The measurement method according to claim 3, wherein
    the acquiring of the parameter includes acquiring, as the parameter, a difference between a first white band width with respect to a first edge of the second overlay mark and a second white band width with respect to a second edge on an opposite side from the first edge of the second overlay mark in the planar image.

5. The measurement method according to claim 3, wherein
    the planar image is an image obtained by imaging the second overlay mark using an electron microscope, and
    the amount of overlay shift is measured using an optical microscope.

6. The measurement method according to claim 3, wherein
    the planar image is an image obtained by imaging the second overlay mark using an atomic force microscope, and
    the amount of overlay shift is measured using an optical microscope.

7. The measurement method according to claim 1, wherein
    the plurality of process conditions includes a plurality of conditions among which at least one of a baking temperature of a resist on which the second overlay mark is formed, an illumination condition of the resist on which the second overlay mark is formed, and a film thickness of the resist on which the second overlay mark is formed is different.

8. A manufacturing method of a device, comprising:
    forming a third layer above a second substrate, the third layer including a third overlay mark;
    forming a fourth layer on the third layer, the fourth layer including a fourth overlay mark above the third overlay mark;

measuring an amount of overlay shift between the third layer and the fourth layer using the third overlay mark and the fourth overlay mark;

correcting the measured amount of overlay shift using an amount of correction which is obtained in advance by:

measuring an amount of overlay shift between a first layer and a second layer using a first overlay mark and a second overlay mark, the first layer being provided as a layer including the first overlay mark above a first substrate, the third layer corresponding to the first layer, the second layer being provided as a layer including the second overlay mark above the first overlay mark, the fourth layer corresponding to the second layer, acquiring an asymmetry parameter with respect to the second overlay mark, the second overlay mark being an edge portion of an opening that exposes the first overlay mark, the asymmetry parameter indicating asymmetry of a cross-sectional shape of a side surface of the second overlay mark, and obtaining the amount of correction with respect to the measured value of the amount of overlay shift based on the acquired parameter and the measured amount of overlay shift; and forming a pattern in the third layer with using the fourth layer as a mask, wherein the obtaining of the amount of correction includes obtaining a correlation between the parameter and the measured value of the amount of overlay shift, and obtaining the amount of correction based on the correlation, the obtaining of the amount of correction based on the correlation includes extrapolating an amount of overlay shift corresponding to a case in which asymmetry is not present in the correlation, and taking a difference between the extrapolated amount of overlay shift and the measured amount of overlay shift to obtain the amount of correction, the obtaining of the correlation includes obtaining a function of a parameter related to asymmetry and a measured value of an amount of overlay shift based on the acquired parameter and the measured amount of overlay shift with respect to a plurality of process conditions, and the extrapolating includes obtaining an amount of overlay shift with respect to a value of the parameter corresponding to a case in which asymmetry is not present using the function.

9. A measurement system comprising:

a controller that measures an amount of overlay shift between a first layer and a second layer using a first overlay mark and a second overlay mark, the first layer being provided as a layer including the first overlay mark above a first substrate, the second layer being provided as a layer including the second overlay mark above the first overlay mark, acquires a parameter related to asymmetry of a shape of the second overlay mark, and obtains an amount of correction with respect to a measured value of the amount of overlay shift based on the acquired parameter and the measured amount of overlay shift, wherein the controller obtains a correlation between the parameter and the measured value of the amount of overlay shift, and obtains the amount of correction based on the correlation, the controller extrapolates an amount of overlay shift corresponding to a case in which asymmetry is not present in the correlation, and takes a difference between the extrapolated amount of overlay shift and the measured amount of overlay shift to obtain the amount of correction, and the controller obtains a function of a parameter related to asymmetry and a measured value of an amount of overlay shift based on the acquired parameter and the measured amount of overlay shift with respect to a plurality of process conditions, and obtains an amount of overlay shift with respect to a value of the parameter corresponding to a case in which asymmetry is not present using the function.

10. The measurement system according to claim 9, wherein the controller measures an amount of overlay shift between a third layer and a fourth layer using a third overlay mark and a fourth overlay mark, the third layer being provided as a layer including the third overlay mark above a second substrate and corresponding to the first layer, the fourth layer being provided as a layer including the fourth overlay mark above the third overlay mark and corresponding to the second layer, and corrects the measured amount of overlay shift between the third layer and the fourth layer using the amount of correction.

11. The measurement system according to claim 9, wherein the controller acquires the parameter by evaluating a planar image of the second overlay mark.

12. The measurement system according to claim 11, wherein the controller acquires, as the parameter, a difference between a first white band width with respect to a first edge of the second overlay mark and a second white band width with respect to a second edge on an opposite side from the first edge of the second overlay mark in the planar image.

13. The measurement system according to claim 11, wherein the controller images the second overlay mark using an electron microscope to acquire the planar image, and images the second overlay mark using an optical microscope to measure the amount of overlay shift.

14. The measurement system according to claim 11, wherein the controller images the second overlay mark using an atomic force microscope to get the planar image, and images the second overlay mark using an optical microscope to measure the amount of overlay shift.

* * * * *